(12) United States Patent
Ahn et al.

(10) Patent No.: US 8,748,893 B2
(45) Date of Patent: Jun. 10, 2014

(54) ARRAY SUBSTRATE FOR LIQUID CRYSTAL DISPLAY DEVICE AND METHOD OF FABRICATING THE SAME

(75) Inventors: Sung-Hoon Ahn, Gumi-si (KR); Kyoung-Nam Lim, Chilgok-gun (KR); Hwan Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 294 days.

(21) Appl. No.: 12/856,456

(22) Filed: Aug. 13, 2010

(65) Prior Publication Data
US 2011/0127532 A1    Jun. 2, 2011

(30) Foreign Application Priority Data
Dec. 2, 2009    (KR) .................. 10-2009-0118281

(51) Int. Cl.
*H01L 31/00*    (2006.01)
(52) U.S. Cl.
USPC .................................. 257/59; 257/72; 438/48
(58) Field of Classification Search
USPC ................... 257/59, 72; 438/48, 128
See application file for complete search history.

(56) References Cited

U.S. PATENT DOCUMENTS

| | | | | |
|---|---|---|---|---|
| 7,064,347 B2 * | 6/2006 | Chang et al. | .................... | 257/59 |
| 2005/0270434 A1 | 12/2005 | Jung et al. | | |
| 2006/0146217 A1 | 7/2006 | Ahn et al. | | |
| 2009/0206338 A1 | 8/2009 | Kim et al. | | |

FOREIGN PATENT DOCUMENTS

| | | |
|---|---|---|
| CN | 1797150 A | 7/2006 |
| CN | 101510031 A | 8/2009 |
| KR | 10-2005-0115743 A | 12/2005 |
| KR | 10-2007-0106260 A | 11/2007 |

\* cited by examiner

*Primary Examiner* — Marc Armand
*Assistant Examiner* — Steven Rao (74) *Attorney, Agent, or Firm* — Birch, Stewart, Kolasch & Birch, LLP (57) ABSTRACT

An array substrate for a liquid crystal display device includes a gate line on a substrate; a gate electrode connected to the gate line; a gate insulating layer on the gate line and the gate electrode and including a gate opening; an active layer on the gate insulating layer and overlapping the gate electrode; an ohmic contact layer on the active layer; a source electrode on the ohmic contact layer; a drain electrode on the ohmic contact layer and spaced apart from the source electrode, wherein one end of the drain electrode is disposed in the gate opening; a data line on the gate insulating layer and connected to the source electrode, the data line crossing the gate line; a passivation layer on the data line and the source and drain electrodes and including a pixel opening, wherein the pixel opening exposes the drain electrode in the gate opening and a portion of the gate insulating layer; and a pixel electrode on the gate insulating layer and in the pixel opening, the pixel electrode contacting the one end of the drain electrode in the gate opening.

16 Claims, 8 Drawing Sheets

FIG. 4F
dry-etching

FIG. 4G

FIG. 4H
wet-etching

FIG. 4I
dry-etching

FIG. 4J

FIG. 4K
dry-etching

ARRAY SUBSTRATE FOR LIQUID CRYSTAL DISPLAY DEVICE AND METHOD OF FABRICATING THE SAME

The present application claims the benefit of Korean Patent Application No. 10-2009-0118281 filed in Korea on Dec. 2, 2009, which is hereby incorporated by reference.

BACKGROUND OF THE INVENTION

1. Field of the Invention

The present invention relates to a liquid crystal display (LCD) device and more particularly to an array substrate including a thin film transistor having improved properties and a method of fabricating the array substrate.

2. Discussion of the Related Art

Since a liquid crystal display (LCD) device has characteristics of light weight, thinness and low power consumption, LCD devices have been widely used. Among the known types of LCD devices, active matrix LCD (AM-LCD) devices, which have thin film transistors (TFTs) arranged in a matrix form, are the subject of significant research and development because of their high resolution and superior ability in displaying moving images.

Generally, the LCD device is manufactured through an array substrate fabricating process, a color filter substrate fabricating process and a cell process. In the array substrate fabricating process, array elements, such as a TFT and a pixel electrode, are formed on a first substrate. In the color filter substrate fabricating process, a color filter and a common electrode are formed on a second substrate. In a cell process, the first and second substrates are attached to each other with a liquid crystal interposed therebetween.

Figure 1:
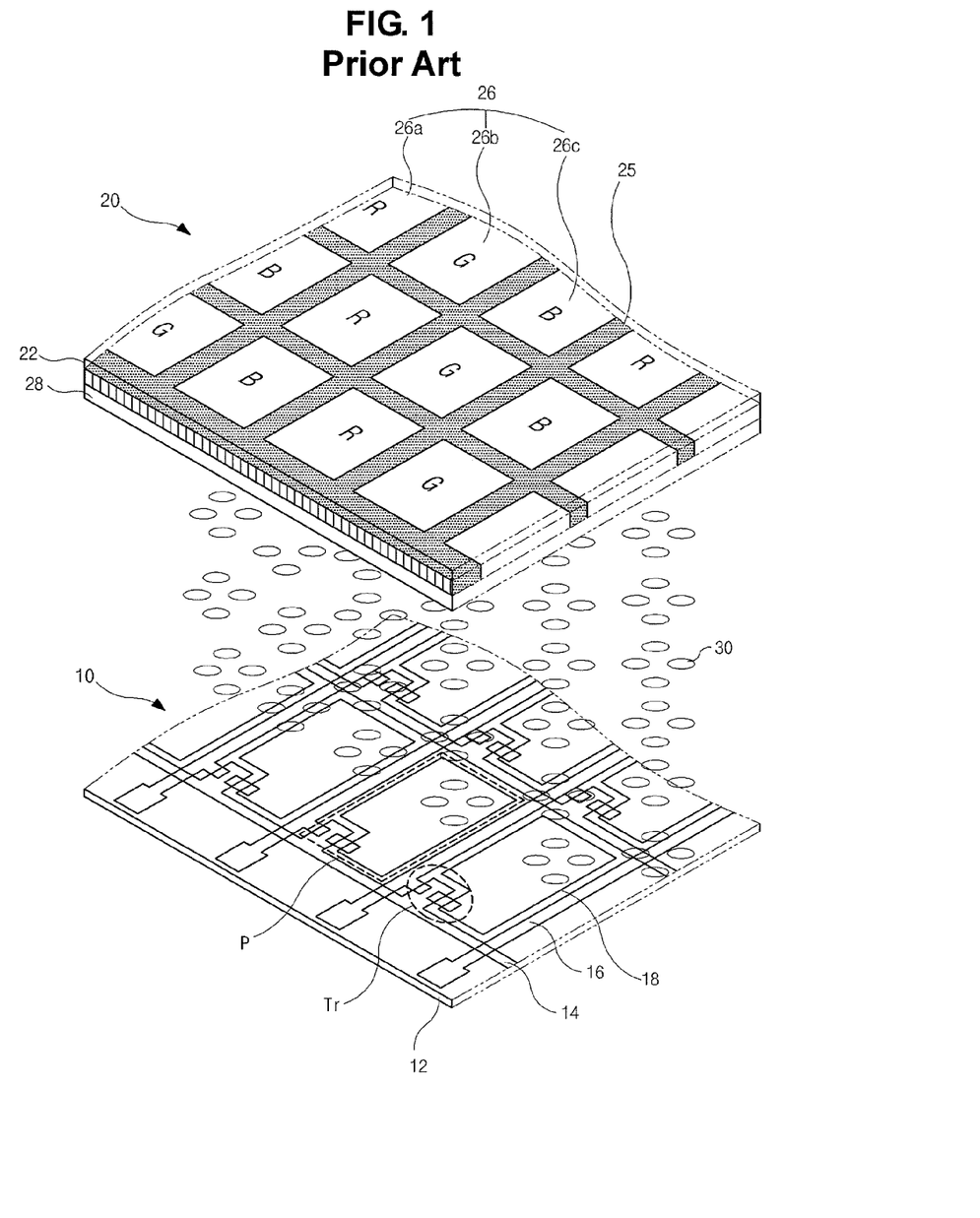
FIG. 1 is an exploded perspective view of a related art LCD device.

FIG. 1 is an exploded perspective view of the related art LCD device. The LCD device includes first and second substrates 12 and 22, and a liquid crystal layer 30. The first and second substrates 12 and 22 face each other, and the liquid crystal layer 30 is interposed therebetween.

The first substrate 12 includes a gate line 14, a data line 16, a TFT "Tr", and a pixel electrode 18. The gate line 14 and the data line 16 cross each other such that a region is formed between the gate and data lines 14 and 16 and is defined as a pixel region "P". The TFT "Tr" is formed at a crossing portion between the gate and data lines 14 and 16, and the pixel electrode 18 is formed in the pixel region "P" and connected to the TFT "Tr".

The second substrate 22 includes a black matrix 25, a color filter layer 26, and a common electrode 28. The black matrix 25 has a lattice shape to cover a non-display region of the first substrate 12, such as the gate line 14, the data line 16, the TFT "Tr". The color filter layer 26 includes first, second, and third sub-color filters 26a, 26b, and 26c. Each of the sub-color filters 26a, 26b, and 26c has one of red, green, and blue colors R, G, and B and corresponds to the each pixel region "P". The common electrode 28 is formed on the black matrix 25 and the color filter layers 26 and over an entire surface of the second substrate 22. The first substrate 12, which includes the TFT "Tr", the pixel electrode 18 and so on, may be referred to as an array substrate 10, and the second substrate 22, which includes the color filter layer 26, the common electrode 28 and so on, may be referred to as a color filter substrate 20.

Although not shown, to prevent the liquid crystal layer 30 from leaking, a seal pattern may be formed along edges of the first and second substrates 12 and 22. First and second alignment layers may be formed between the first substrate 12 and the liquid crystal layer 30 and between the second substrate 22 and the liquid crystal layer 30. A polarizer may be formed on an outer surface of the first and second substrates 12 and 22.

The LCD device further includes a backlight assembly (not shown) under the first substrate 12 to supply light to the liquid crystal layer 30. When a scanning signal is applied to the gate line 14 to control the TFT "Tr", a data signal is applied to the pixel electrode 18 through the data line 16 such that the electric field is induced between the pixel and common electrodes 18 and 28. As a result, the LCD device produces images using the light from the backlight assembly.

Figure 2:
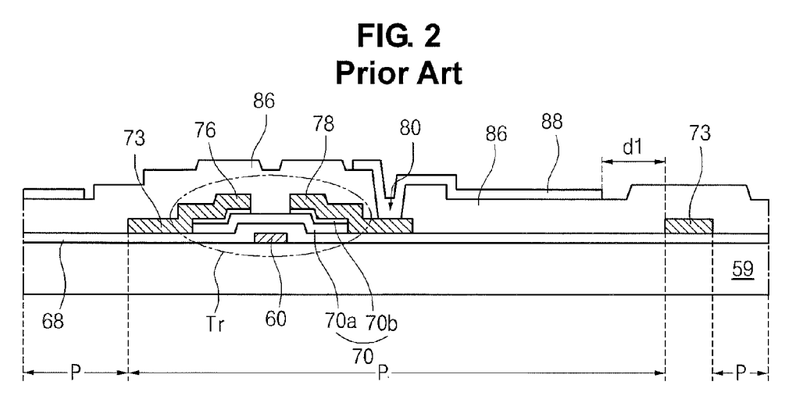
FIG. 2 is a cross-sectional view of one pixel region of an array substrate for the related art LCD device.

FIG. 2 is a cross-sectional view of one pixel region of an array substrate for the related art LCD device. Referring to FIG. 2, a gate line (not shown) and a data line 73 are disposed on a substrate 59. The gate line and the data line 73 cross each other to define a pixel region P. A gate electrode 60 connected to the gate line is disposed in the pixel region P and on the substrate 59. A gate insulating layer 68 is disposed on the gate line and the gate electrode 60. A semiconductor layer 70 including an active layer 70a and an ohmic contact layer 70b is disposed on the gate insulating layer 68 to correspond to the gate electrode 60. A source electrode 76 and a drain electrode 78 are disposed on the ohmic contact layer 70b. The source electrode 76 is connected to the data line 73, and the drain electrode 78 is spaced apart from the source electrode 76. The gate electrode 60, the gate insulating layer 68, the semiconductor layer 70, the source electrode 76 and the drain electrode 78 constitute a TFT Tr. Since the semiconductor layer 70 and the source and drain electrodes 76 and 78 are formed through different mask process, the source and drain electrodes 76 and 78 cover both ends of the semiconductor layer 70, respectively.

A passivation layer 86 including a drain contact hole 80 is disposed on the data line 73 and the TFT Tr. The drain contact hole 80 exposes a portion of the drain electrode 78. A pixel electrode 88 is disposed on the passivation layer 86 in each pixel region P and contacts the drain electrode 78 through the drain contact hole 87.

These elements of the array substrate are formed by a photolithography process. The photolithography process may be referred to as a mask process. The mask process includes a step of forming a photoresist (PR) layer on an objective layer, a step of exposing the PR layer to light using a first mask, a step of developing the exposed PR layer to form a PR pattern, a step of etching the objective layer using the PR pattern as an etching mask to form a desired pattern, and a step of stripping the PR pattern. The PR material for the PR layer is classified into a positive type and a negative type. In the positive type, exposed portion are developed. On the contrary, in the negative type, exposed portions remain to form the PR pattern.

A fabricating method of the array substrate show in FIG. 2 will be explained below.

A first metal layer (not shown) is formed on the substrate 59 by depositing a first metallic material. The first metal layer is patterned by a first mask process to the gate line and the gate electrode 60. Next, the gate insulating layer 68 is formed by depositing or coating a first insulating material. Next, an intrinsic amorphous silicon layer (not shown) and an impurity-doped amorphous silicon layer (not shown) are sequentially formed on the gate insulating layer 68 by depositing intrinsic amorphous silicon and impurity-doped amorphous silicon. The intrinsic amorphous silicon layer and the impurity-doped amorphous silicon layer are patterned by a second mask process to form the semiconductor layer 70 including the active layer 70a and the ohmic contact layer 70b.

Next, a second metal layer (not shown) is formed on the semiconductor layer 70 by depositing a second metallic material. The second metal layer is patterned by a third mask process to form the data line 73, the source electrode 76 and the drain electrode 78. A center portion of the ohmic contact layer 70b is removed using the source and drain electrodes 76 and 78 as an etching mask such that a center portion of the active layer 70a is exposed. The gate electrode 60, the gate insulating layer 68, the semiconductor layer 70, the source electrode 76 and the drain electrode 78 constitute a TFT Tr.

Next, the passivation layer 86 is formed on the data line 73 and the TFT Tr by depositing or coating a second insulating material. The passivation layer 86 is patterned by a fourth mask process to form the drain contact hole 80. Next, a transparent conductive material layer (not shown) is formed on the passivation layer 86 by depositing a transparent conductive material. The transparent conductive material layer is patterned by a fifth mask process to form the pixel electrode 88.

Namely, the array substrate in FIG. 2 is fabricated by a five mask process. As a number of the mask process is increased, production costs are increase and production yield is decreased.

Figure 3:
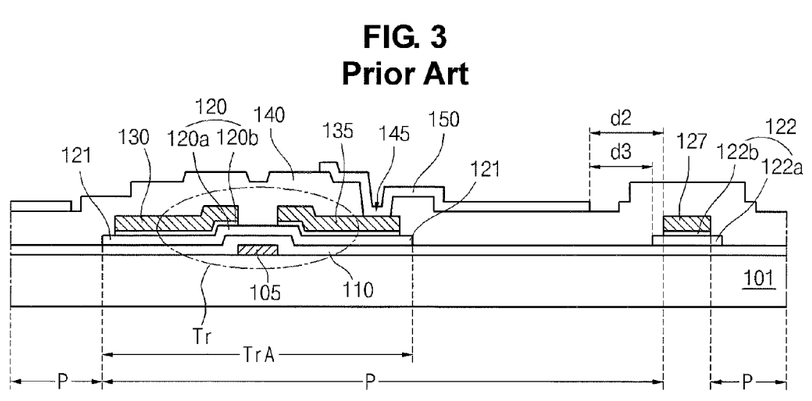
FIG. 3 is a cross-sectional view of one pixel region of an array substrate for the related art LCD device.

To resolve these problems, an array substrate fabricated by a four mask process is introduced. FIG. 3 is a cross-sectional view of one pixel region of an array substrate for the related art LCD device.

Referring to FIG. 3, after forming the gate line (not shown) and the gate electrode 105, an insulating material, intrinsic amorphous silicon, impurity-doped amorphous silicon, and a metallic material are sequentially deposited to form the gate insulating layer 110, an intrinsic amorphous silicon layer (not shown), an impurity-doped amorphous silicon layer (not shown), and a metallic material layer. The metallic material layer, the intrinsic amorphous silicon layer and the impurity-doped amorphous silicon layer are patterned by a single mask process, where a refractive exposing mask or a half-tone mask is used, to form the semiconductor layer 120, which includes the active layer 120a and the ohmic contact layer 120b, the data line 127, the source electrode 130 and the drain electrode 135. Since the semiconductor layer 120, the data line 127, the source electrode 130 and the drain electrode 135 in the array substrate shown in FIG. 3 are formed by a single mask process, the array substrate in FIG. 3 can be fabricated by a four mask process.

Unfortunately, there are some problems on the array substrate fabricated by the fourth mask process. In the four mask process, since the semiconductor layer 120, the data line 127, the source electrode 130 and the drain electrode 135 are formed by a single mask process using a refractive exposing mask or a half-tone mask, ends 121 of the active layer 120a is not covered by the source and drain electrodes 130 and 135. Light from an exterior space is irradiated into the ends 121 of the active layer 120a such that problems, for example, photo-current leakage, are generated in the TTFT Tr.

In addition, an active pattern 122a and an ohmic contact pattern 122b are formed under the data line 127. Light from the backlight unit under the array substrate is irradiated on the active pattern 122a such that problems, for example, wavy noise, are generated. As a result, displaying image quality is deteriorated.

Furthermore, since the active pattern 122a protrudes beyond the data line 127 and has a width greater than the data line 127, an aperture ratio is reduced. The pixel electrode should have a distance from the data line. Namely, referring again to FIG. 2, to avoid an electrical interference between the data line 73 and the pixel electrode 88, the pixel electrode 88 has a first distance d1 from the data line 73. Referring to FIG. 3, since there is the active pattern 122a, which protrudes beyond the data line 127, the pixel electrode 150 should have a second distance d2, which is greater than the first distance d1 (of FIG. 2), from the data line 127. Namely, to avoid an electrical interference between the active pattern 122a and the pixel electrode 150, the pixel electrode 150 has a third distance d3, which is equal to the first distance d1 (of FIG. 2), from the active pattern 122a. Since the pixel electrode 150 should have a greater distance from the data line 127, a black matrix, which is disposed on a counter substrate, for preventing light leakage through a space between the pixel electrode 150 and the data line 127, should have a larger width. As a result, an aperture ratio is reduced.

SUMMARY OF THE INVENTION

Accordingly, the present invention is directed to an array substrate for a liquid crystal display device and a method of fabricating the same that substantially obviates one or more of the problems due to limitations and disadvantages of the related art.

An object of the present invention is to provide an array substrate having an advantage in production costs.

Another object of the present invention is to provide an array substrate being capable of preventing a photo-current leakage problem and a wavy noise problem.

Another object of the present invention is to provide an array substrate having an advantage in an aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for a liquid crystal display device includes a gate line on a substrate; a gate electrode connected to the gate line; a gate insulating layer on the gate line and the gate electrode and including a gate opening; an active layer on the gate insulating layer and overlapping the gate electrode; an ohmic contact layer on the active layer; a source electrode on the ohmic contact layer; a drain electrode on the ohmic contact layer and spaced apart from the source electrode, wherein one end of the drain electrode is disposed in the gate opening; a data line on the gate insulating layer and connected to the source electrode, the data line crossing the gate line; a passivation layer on the data line and the source and drain electrodes and including a pixel opening, wherein the pixel opening exposes the drain electrode in the gate opening and a portion of the gate insulating layer; and a pixel electrode on the gate insulating layer and in the pixel opening, the pixel electrode contacting the one end of the drain electrode in the gate opening.

In another aspect of the present invention, a method of fabricating an array substrate for a liquid crystal display device includes forming a gate line and a gate electrode on a substrate, the gate electrode connected to the gate line; forming a gate insulating layer on the gate line and the gate electrode, an active layer on the gate insulating layer, and an impurity-doped amorphous silicon pattern on the active layer, wherein the gate insulating layer including a gate opening, and the active layer overlaps the gate electrode; forming a data line on the gate insulating layer, and source and drain electrodes on the impurity-doped amorphous silicon layer, the data line connected to the source electrode and crossing the gate line, the drain electrode spaced apart from the source electrode, wherein one end of the drain electrode is disposed in the gate opening; etching a portion of the impurity-doped amorphous silicon layer exposed a space between the source and drain electrodes to expose a portion of the active layer; and forming a passivation layer, which is disposed on the data line and the source and drain electrodes and including a pixel opening, and a pixel electrode in the pixel opening, wherein the pixel opening exposes the drain electrode in the gate opening and a portion of the gate insulating layer such that the pixel electrode contacts the drain electrode in the gate opening and is disposed on the gate insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

FIGS. 4A to 4M are cross-sectional views showing a fabricating process of an array substrate according to the present invention. A region, where a thin film transistor (TFT) is formed, is defined as a switching region TrA in a pixel region P.

Figure 4A:
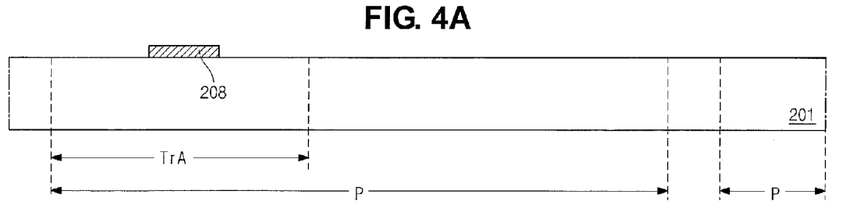
FIGS. 4A to 4M are cross-sectional views showing a fabricating process of an array substrate according to the present invention.

FIG. 4A shows a first mask process. In FIG. 4A, a first metallic material layer (not shown) is formed on the substrate 201. The substrate 201 is transparent and has an insulating property. The first metallic material layer is patterned by a first mask process to form the gate line (not shown) and the gate electrode 208. The gate electrode 208 is connected to the gate line and is disposed in the switching region TrA. Although not shown, the first mask process includes a step of forming a photoresist (PR) layer, a step of exposing the PR layer to light using a first mask, a step of developing the exposed PR layer to form a PR pattern, a step of etching the first metallic material layer using the PR pattern as an etching mask and a step of stripping the PR pattern.

The first metallic material includes one of Aluminum (Al), Al alloy, copper (Cu), Cu alloy and chromium (Cr). For example, the Al alloy may be Al neodymium (AlNd). The first metallic material layer may have a multiple-layered structure. In this case, each of the gate line and the gate electrode 208 has a multiple-layered structure. For example, by sequentially depositing two of the first metallic material group, each of the gate line and the gate electrode 208 has a double-layered structure. The gate electrode 208 extends from the gate line. Alternatively, a portion of the gate line serves as the gate electrode 208.

Figure 4B:
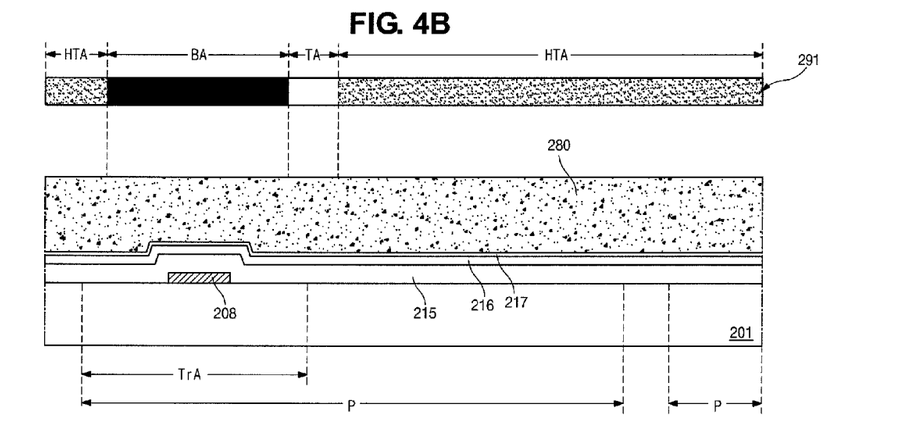

FIGS. 4B to 4G show a second mask process. In FIG. 4B, an inorganic insulating material, such as silicon oxide ($SiO_2$) and silicon nitride (SiNx), is deposited on the substrate 201, where the gate line and the gate electrode 208 are formed, to form a gate insulating layer 215. An intrinsic amorphous silicon layer 216 and an impurity-doped amorphous silicon layer 217 are sequentially formed on the gate insulating layer 215.

A first PR layer 280 is formed on the impurity-doped amorphous silicon layer 217 by coating a PR material. The PR material is a positive type such that exposed portions are removed by a developing step. Alternatively, a negative type PR material can be used. In this case, a position of a transmissive area and a blocking area should be changed.

An exposing mask 291, which includes the transmissive area TA, a half-transmissive area HTA and the blocking area BA, is disposed over the first PR layer 280.

The transmitting area TA has a relatively high transmittance so that light through the transmitting area TA can completely change the first PR layer 280 chemically. The blocking area BA shields light completely. The half-transmitting area HTA has a slit structure or a half-transmitting film so that intensity or transmittance of light through the half-transmitting area HTA can be lowered. As a result, a transmittance of the half-transmitting area HTA is smaller than that of the transmitting area TA and is greater than that of the blocking area BA. The blocking area BA corresponds to the semiconductor layer 224 (of FIG. 4M), and the transmissive area TA corresponds to a gate opening GOP (of FIG. 4M). The half-transmissive area HTA corresponds to other portions.

Figure 4C:
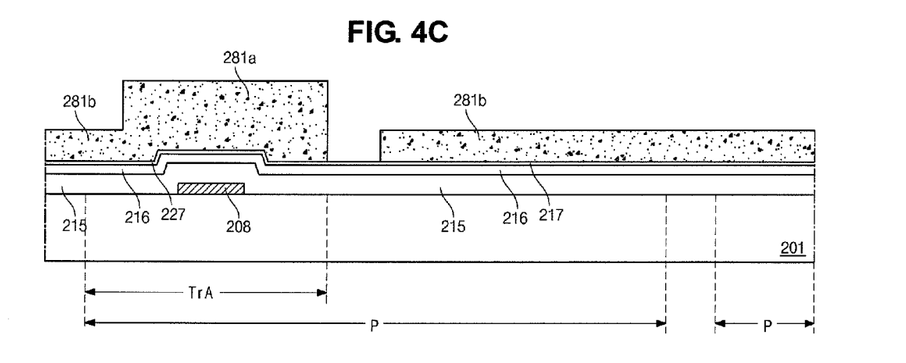

The first PR layer 280 is exposed through the exposing mask 291. Then, the first PR layer 280 is developed to form the first and second PR patterns 281a and 281b, as shown in FIG. 4C. The first PR pattern 281a has a first thickness and corresponds to the gate electrode 208. A portion of the first PR layer 280 (of FIG. 4B) under the transmissive area TA is removed such that a portion of the impurity-doped amorphous silicon layer 217 is exposed through the first and second PR patterns 218a and 281b. The second PR pattern 281b has a second thickness smaller than the first thickness and corresponds to the half-transmissive area HTA.

Figure 4D:
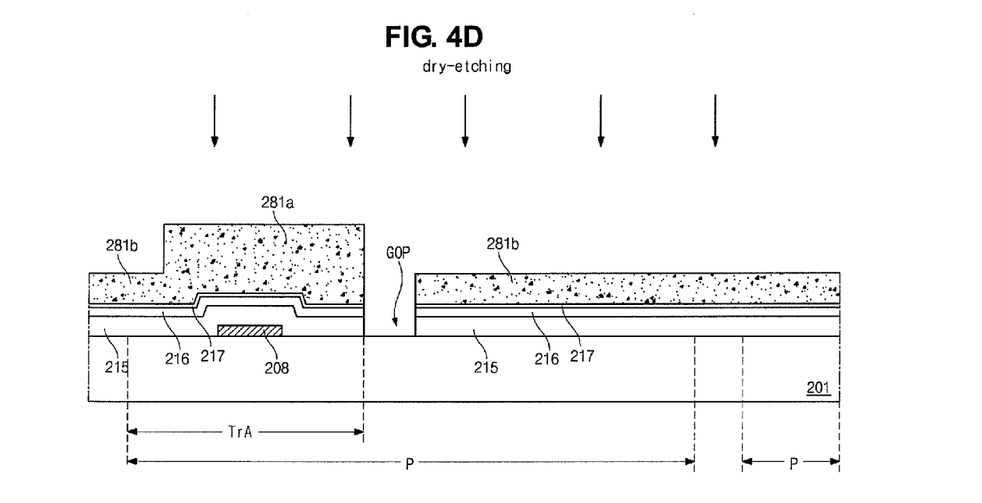

Next, in FIG. 4D, the impurity-doped amorphous silicon layer 217 exposed through the first and second PR patterns 218a and 281b, and the intrinsic amorphous silicon layer 216 and the gate insulating layer 215 are dry-etched using the first and second PR patterns 281a and 281b as an etching mask such that the gate opening GOP is formed. A portion of the substrate 201 is exposed through the gate opening GOP.

When a passivation layer is patterned to expose a drain electrode, a portion of the gate insulating layer is also etched such that a cavity is generated under the drain electrode. If there is the cavity under the drain electrode, there may be a contact problem between the drain electrode and a pixel electrode. In the present invention, the gate opening GOP is formed to prevent the cavity. Since the substrate 201 is not etched during an etching process for the passivation layer 250, there is no cavity under the drain electrode 243 with the gate opening GOP. Accordingly, a contact problem between the drain electrode 243 and a pixel electrode 260 is not generated.

Since a portion of the impurity-doped amorphous silicon layer 217 is covered with the first and second PR patterns 281a and 281b, the impurity-doped amorphous silicon layer 217, the intrinsic amorphous silicon layer 216 and the gate insulating layer 215 remains under the first and second PR patterns 281a and 281b.

Figure 4E:
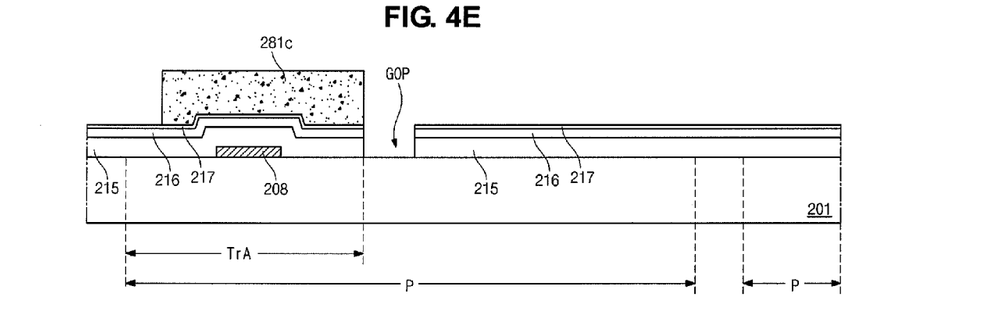

Next, in FIG. 4E, the second PR pattern 281b (of FIG. 4D) is removed by an ashing process such that a portion of the impurity-doped amorphous silicon layer 217 is exposed. A thickness of the first PR pattern 281a (of FIG. 4D) is reduced such that a third PR pattern 281c having a smaller thickness than the first PR pattern is formed on the impurity-doped amorphous silicon layer 217 and in the switching region TrA.

Figure 4F:
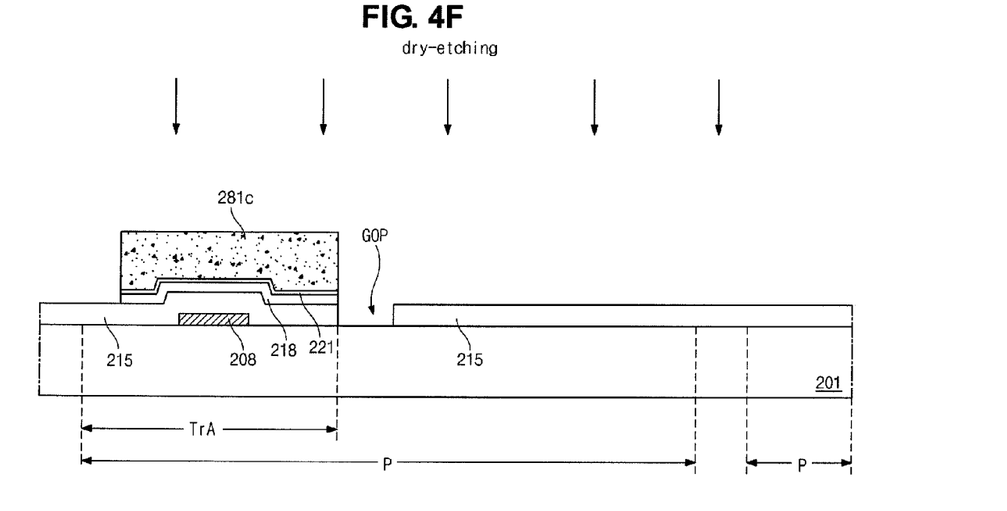

Next, in FIG. 4F, an exposed portion of the impurity-doped amorphous silicon layer 217 (of FIG. 4E), the intrinsic amorphous silicon layer 216 under the exposed portion of the impurity-doped amorphous silicon layer 217 (of FIG. 4E) are dry-etched to form an impurity-doped amorphous silicon pattern 221 and an active layer 218 in the switching region TrA. The impurity-doped amorphous silicon pattern 221 and the active layer 218 have an island shape. At the same time, the gate insulating layer 215 is exposed. Namely, the gate insulating layer 215 covers regions of the substrate 201 except the switching region TRA and the gate opening GOP.

Figure 4G:
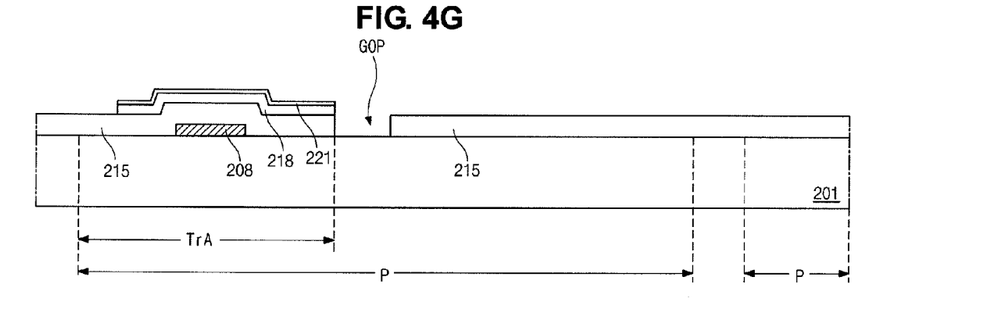

Next, in FIG. 4G, a stripping process is performed onto the substrate 201 to remove the third PR pattern 281c (of FIG. 4F).

Figure 4H:
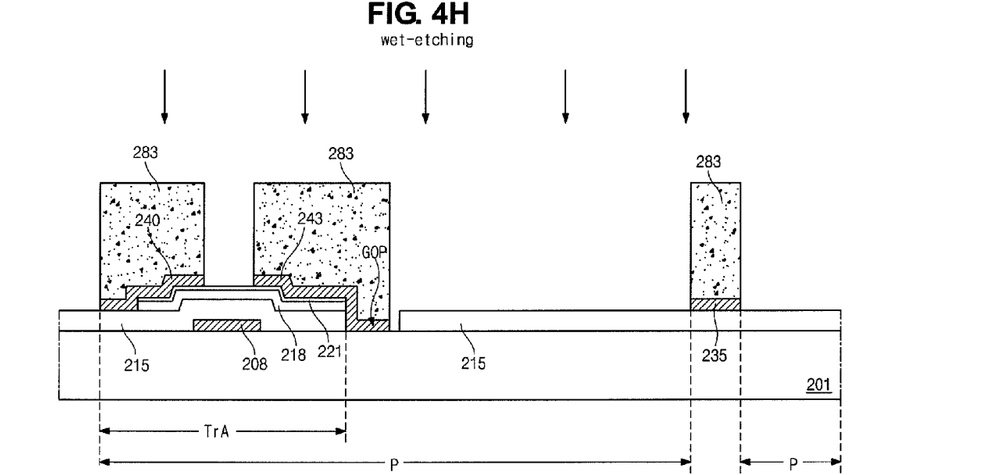
Figure 4I:
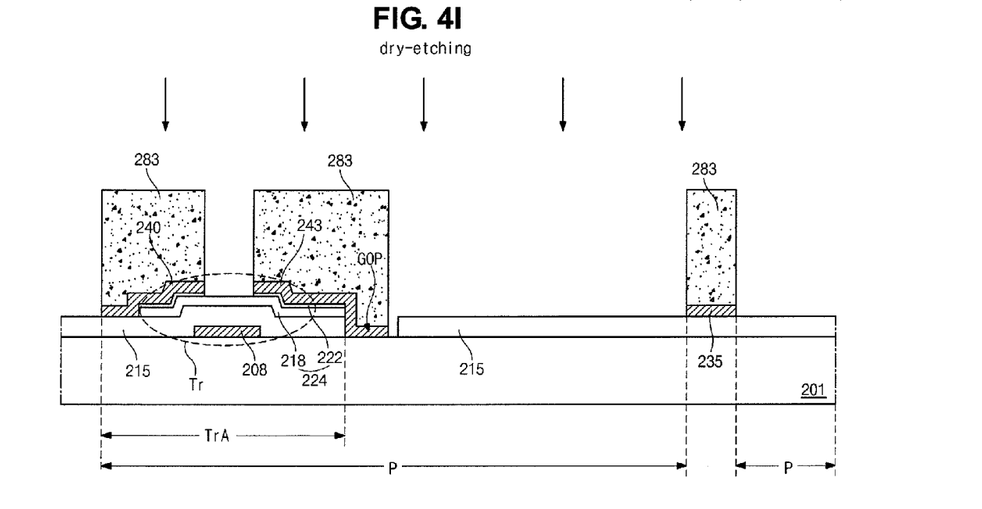

FIGS. 4H and 4I show a third mask process. In FIG. 4H, a second metal layer (not shown) is formed on the impurity-doped amorphous silicon pattern 221 and the gate insulating layer 215 by depositing a second metallic material. For example, the second metallic material includes one of molybdenum (Mo), Mo-titanium alloy (MoTi), Cr, Al, Al alloy, Cu and Cu alloy. For example, the Al alloy may be Al neodymium (AlNd). A second PR layer (not shown) is formed on the second metal layer by depositing a PR material. The second PR layer is exposed and developed using a mask to form a fourth PR pattern 283. The fourth PR pattern 283 corresponds to a boundary of the pixel region P and edges of the switching region TrA. Namely, a portion of the fourth PR pattern 283 corresponds to a data line 235, and a center portion of the second metal layer in the switching region TrA is exposed through the fourth PR pattern 283.

The exposed portions of the second metal layer is wet-etched using the fourth PR pattern 283 as an etching mask to form the data line 235, a source electrode 240 and a drain electrode 243. The data line 235 crosses the gate line (not shown) such that the pixel region P is defined. The source and drain electrodes 240 and 243 are disposed on the impurity-doped amorphous silicon pattern 221 in the switching region TrA. The source electrode 240 is connected to the data line 235 and spaced apart from the drain electrode 243. Namely, one end of the source electrode 240 faces and has a distance from one end of the drain electrode 243 such that a portion of the impurity-doped amorphous silicon pattern 221 is exposed through a space between the source and drain electrodes 240 and 243. In addition, one end of the impurity-doped amorphous silicon pattern 221 and one end of the active layer 218 are covered with the other end of the source electrode 240, and the other end of the impurity-doped amorphous silicon pattern 221 and the other end of the active layer 218 are covered with the other end of the drain electrode 243. The other end of the drain electrode 243 extends into the gate opening GOP to contact a top surface of the substrate 201 and a side surface of the substrate 201.

Next, in FIG. 4I, the exposed portion of the impurity-doped amorphous silicon layer 221 (of FIG. 4H) is dry-etched using the source and drain electrodes 240 and 243 as an etching mask to form an ohmic contact layer 222 and expose a portion of the active layer 218.

Since the opposite ends of the active layer 218 are covered with the source and drain electrodes 240 and 243, respectively, there is no photo-current problem. In addition, since the data line 235 directly contact the gate insulating layer without the semiconductor pattern 122 (of FIG. 3), a wavy noise problem is prevented and an aperture ratio is not reduced.

The gate electrode 208, the gate insulating layer 215, the semiconductor layer 224 including the active layer 218 and the ohmic contact layer 222, the source electrode 240 and the drain electrode 243 constitute a thin film transistor (TFT) Tr in the switching region. The data line 235, the source electrode 240, the drain electrode 243 and the ohmic contact layer 222 are formed by a third mask process shown in FIGS. 4H and 4I.

Figure 4J:
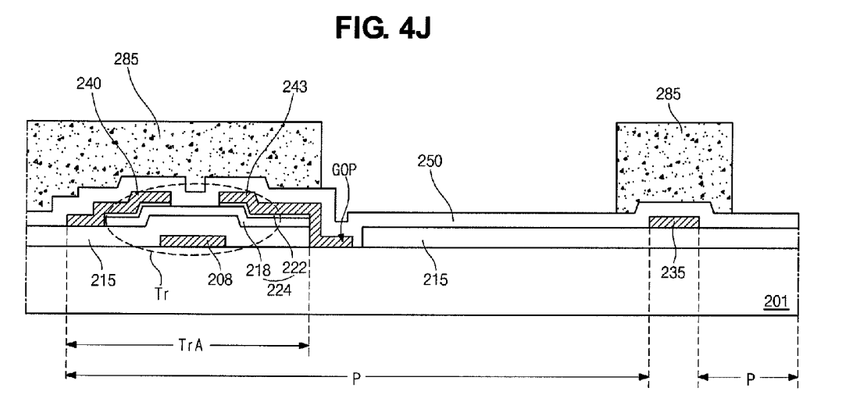

FIGS. 4J to 4M show a fourth mask process. In FIG. 4J, a stripping process is performed onto the substrate 201 to remove the fourth PR pattern 283 (of FIG. 4I). Next, a passivation layer 250 is formed on an entire surface of the substrate 201. Namely, the passivation layer 250 is formed on the data line 235, the source and drain electrodes 240 and 243 of the TFT Tr and the gate insulating layer 215 by depositing an insulating material. For example, the insulating layer for the passivation layer 250 is formed of an inorganic insulating material, for example, silicon oxide or silicon nitride.

A third PR layer (not shown) is formed on the passivation layer 250 by coating a PR material. The third PR layer is exposed and developed using a mask (not shown) to form a fifth PR pattern 285. The fifth PR pattern 285 corresponds to the data line 235 and the switching region TrA. Namely, a portion of the passivation layer, where a pixel electrode 260 (of FIG. 4M) is formed, is exposed by the fifth PR pattern 285.

Figure 4K:
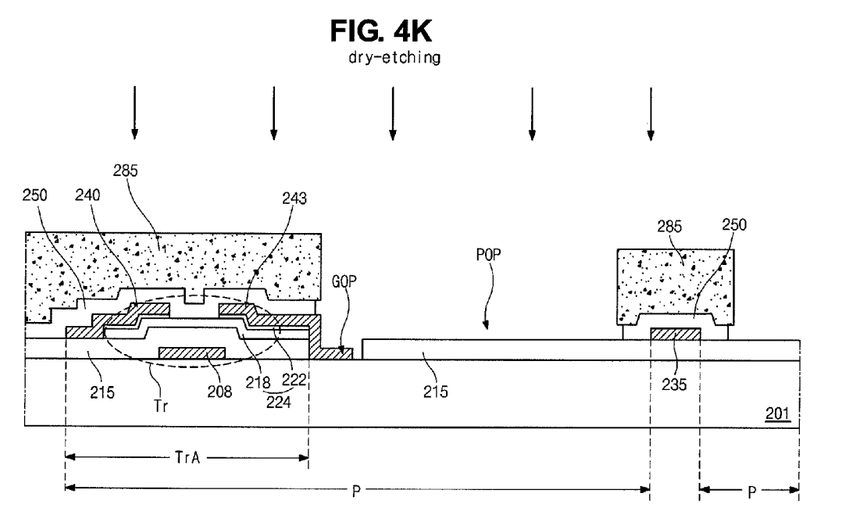

Next, in FIG. 4K, the exposed portion of the passivation layer 250 is dry-etched using the fifth PR pattern 285 as an etching mask to form a pixel opening POP. The end of the drain electrode 243 in the gate opening GOP and the gate insulating layer 215 in the pixel region P are exposed by the pixel opening POP.

In the related art, when the passivation layer is patterned to expose a drain electrode, an over-etching process is performed to completely remove the passivation layer such that a portion of the gate insulating layer is also etched such that a cavity is generated under the drain electrode. Therefore, there is a problem of an electrical connection between the drain electrode and the pixel electrode.

However, in the present invention, the gate opening GOP is formed to prevent the cavity. Since the substrate 201 is not etched during an etching process for the passivation layer 250, there is no cavity under the drain electrode 243 with the gate opening GOP. Accordingly, a contact problem between the drain electrode 243 and a pixel electrode 260 is not generated.

The passivation layer 250 is over-etched. As a result, the passivation layer 250 below the fifth PR pattern 285 has an under-cut shape.

Figure 4L:
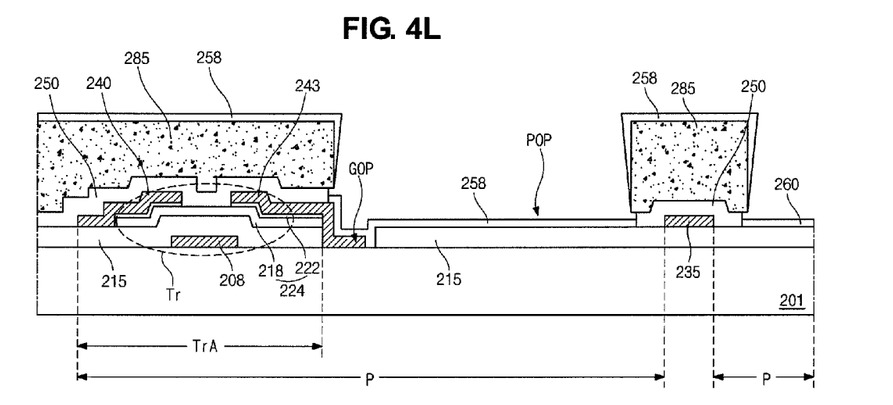

Next, in FIG. 4L, a transparent conductive material layer 258 is formed on the fifth PR pattern 285, the drain electrode 243 and the gate insulating layer 215 by depositing a transparent conductive material. For example, the transparent conductive material includes one of indium-tin-oxide (ITO) and indium-zinc-oxide (IZO). Since the passivation layer 250 has the under-cut shape with respect to the fifth PR pattern 285, the transparent conductive material layer 258 has a discontinuation part at a boundary between the passivation layer 250 and the fifth PR pattern 285. If the transparent conductive material layer 258 has a thickness greater than the passivation layer 250, there is no discontinuation part at the transparent conductive material layer 258 even if there is the under cut-shape at the boundary between the passivation layer 250 and the fifth PR pattern 285. Accordingly, the transparent conductive material layer 258 in the present invention has a thickness smaller than the passivation layer 250.

Figure 4M:
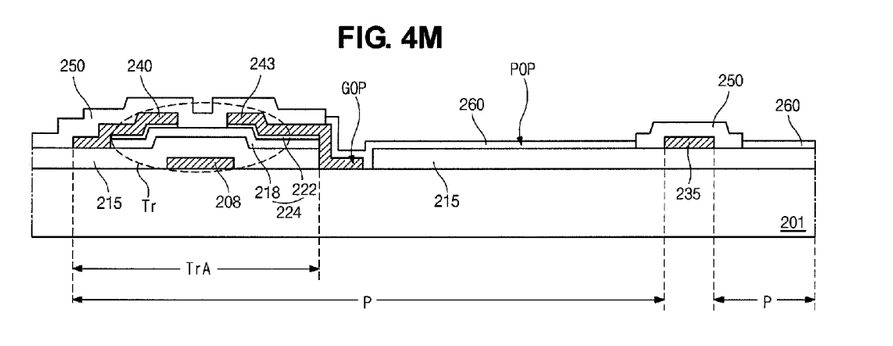

Next, in FIG. 4M, the substrate 201 including the transparent conductive material layer 258 (of FIG. 4L) is exposed to a stripping solution. The substrate 201 is dipped into a stripping solution. Alternatively, a stripping solution is sprayed onto the substrate 201. The fifth PR pattern 285 reacts with the stripping solution such that the fifth PR pattern 285 (of FIG. 4L) with the transparent conductive material layer 258 on the fifth PR pattern 285 are removed from the substrate 201. Since the transparent conductive material layer 258 has the discontinuation part such that a portion of the fifth PR pattern 285 is exposed, the stripping solution can react with the exposed portion of the fifth PR pattern 285. An adhesive strength between the passivation layer 250 and the fifth PR pattern 285 become weak due to the stripping solution such that the fifth PR pattern can be removed from the passivation layer 250. At the same time, the transparent conductive material layer 258 covering an upper surface and a side surface of the fifth PR pattern 285 is also removed. The process for simultaneously removing the fifth PR pattern 285 and the transparent conductive material layer 258 may be referred to as a lifting-off process.

As a result, the pixel electrode 260 is formed on the gate insulating layer 215 and in the pixel opening POP. One end of the pixel electrode 260 contacts the drain electrode 243 in the gate opening GOP. Since the passivation layer 250 and the pixel electrode 260 are patterned by a single mask process, an end of the pixel electrode 260 meets an end of the passivation layer 250. Although not shown, the pixel opening OP exposes a portion of the gate insulating layer 215 corresponding to a previous gate line. A portion of the pixel electrode 260, which is disposed directly on the gate insulating layer 215, overlaps a previous gate line such that the overlapped portion of the previous gate line, the overlapped portion of the pixel electrode 260 and the gate insulating layer 215 therebetween constitute a storage capacitor.

Since the passivation layer 250 and the pixel electrode 260 are formed by one mask process using the lifting-off process, the array substrate in the present invention is fabricated by a four mask process. Being different from the related art array substrate fabricated by a four mask process, the active layer 218 has an island shape in the switching region TrA. Accordingly, there is no photo-current leakage problem.

In addition, there is no active pattern under the data line 235, a wavy noise problem is prevented. Furthermore, an aperture ratio is not reduced.

Moreover, there is no cavity between the drain electrode 243 and the gate insulating layer 215 due to the gate opening, which exposes a surface of the substrate 201, there is no problem in an electrical connection between the drain electrode 243 and the pixel electrode 260.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate for a liquid crystal display device, comprising:
    a gate line on a substrate including a pixel region;
    a gate electrode connected to the gate line;
    a gate insulating layer on the gate line and the gate electrode and including a gate opening, the gate opening exposing a top surface of the substrate, wherein the gate insulating layer in a first portion of the pixel region is removed to form the gate opening, and the gate insulating layer in a second portion of the pixel region covers the substrate;
    an active layer on the gate insulating layer and overlapping the gate electrode;
    an ohmic contact layer on the active layer;
    a source electrode on the ohmic contact layer;
    a drain electrode on the ohmic contact layer and spaced apart from the source electrode, wherein one end of the drain electrode is disposed in the gate opening and contacts the top surface of the substrate;
    a data line on the gate insulating layer and connected to the source electrode, the data line crossing the gate line to define the pixel region;
    a passivation layer on the data line and the source and drain electrodes and including a pixel opening, wherein the pixel opening exposes the drain electrode in the gate opening and a portion of the gate insulating layer; and
    a pixel electrode disposed in the pixel opening and the pixel region such that the pixel electrode contacts a top surface of the gate insulating layer in the second portion of the pixel region, the pixel electrode contacting the one end of the drain electrode in the gate opening.

2. The array substrate according to claim 1, wherein one end of the active layer is covered with one end of the source electrode, and the other end of the active layer is covered with the one end of the drain electrode.

3. The array substrate according to claim 1, wherein the pixel electrode has a thickness smaller than the passivation layer.

4. The array substrate according to claim 1, wherein an end of the pixel electrode meets an end of the passivation layer.

5. The array substrate according to claim 1, wherein the gate opening exposes the top surface of the substrate such that the drain electrode in the gate opening contacts the top surface of the substrate and a side surface of the gate insulating layer.

6. The array substrate according to claim 1, wherein a portion of the pixel electrode overlaps a previous gate line such that an overlapped portion of the previous gate line, an overlapped portion of the pixel electrode and the gate insulating layer between the overlapped portion of the previous gate line and the overlapped portion of the pixel electrode constitute a storage capacitor.

7. A method of fabricating an array substrate for a liquid crystal display device, comprising:
    forming a gate line and a gate electrode on a substrate including a pixel region, the gate electrode connected to the gate line;
    forming a gate insulating layer on the gate line and the gate electrode, an active layer on the gate insulating layer, and an impurity-doped amorphous silicon pattern on the active layer, wherein the gate insulating layer in a first portion of the pixel region is removed to have a gate opening for exposing a top surface of the substrate, and the active layer overlaps the gate electrode, and wherein the gate insulating layer in a second portion of the pixel region covers the substrate;
    forming a data line on the gate insulating layer and crossing the gate line to define the pixel region, and source and drain electrodes on the impurity-doped amorphous silicon layer, the data line connected to the source electrode and crossing the gate line, the drain electrode spaced apart from the source electrode, wherein one end of the drain electrode is disposed in the gate opening and contacts the top surface of the substrate;

etching a portion of the impurity-doped amorphous silicon layer exposed a space between the source and drain electrodes to expose a portion of the active layer; and forming a passivation layer, which is disposed on the data line and the source and drain electrodes and including a pixel opening, and a pixel electrode in the pixel opening, wherein the pixel opening exposes the drain electrode in the gate opening and a portion of the gate insulating layer in the second portion of the pixel region such that the pixel electrode contacts the drain electrode in the gate opening and a top surface of the gate insulating layer in the second portion of the pixel region.

8. The method according to claim 7, wherein the step of forming the passivation layer and the pixel electrode includes:

forming a passivation layer on an entire surface of the substrate including the data line, the source and drain electrodes;

forming a photoresist pattern on the passivation layer and corresponding to the data line, the source electrode and a portion of the drain electrode;

etching a portion of the passivation layer using the photoresist pattern as an etching mask to expose a portion of the gate insulating layer and the one end of the drain electrode in the gate opening;

forming a transparent conductive material layer on an entire surface of the substrate including the photoresist pattern; and simultaneously removing the photoresist pattern and a portion of the transparent conductive material layer on the photoresist pattern to form a pixel electrode on the gate insulating layer, the pixel electrode contacting the one end of the drain electrode in the gate opening.

9. The method according to claim 8, wherein the portion of the passivation layer is over-etched such that the passivation layer below the photoresist pattern has an under-cut shape.

10. The method according to claim 9, wherein the transparent conductive material layer has a discontinuation part at a boundary of the passivation layer and the photoresist pattern.

11. The method according to claim 8, wherein the transparent conductive material layer has a thickness smaller than the passivation layer.

12. The method according to claim 7, wherein one end of the active layer is covered with one end of the source electrode, and the other end of the active layer is covered with the one end of the drain electrode.

13. The method according to claim 7, wherein the drain electrode in the gate opening contacts the top surface of the substrate and a side surface of the gate insulating layer.

14. The method according to claim 7, wherein the step of forming the gate insulating layer, the active layer and the impurity-doped amorphous silicon pattern includes:

sequentially forming the gate insulating layer, an intrinsic amorphous silicon layer and an impurity-doped amorphous silicon layer;

forming first and second photoresist patterns on the impurity-doped amorphous silicon layer, the first photoresist pattern having a thickness greater than the second photoresist pattern, the first photoresist pattern corresponding to the impurity-doped amorphous silicon pattern, wherein a portion of the impurity-doped amorphous silicon layer corresponding to the gate opening is exposed through the first and second photoresist patterns;

etching the exposed portion of the impurity-doped amorphous silicon pattern, and the intrinsic amorphous silicon layer and the gate insulating layer under the exposed portion of the impurity-doped amorphous silicon pattern to form the gate opening;

removing the second photoresist pattern by an ashing process to expose another portion of the impurity-doped amorphous silicon layer;

etching the another portion of the impurity-doped amorphous silicon layer and the intrinsic amorphous silicon layer under the another portion of the impurity-doped amorphous silicon layer to form the active layer and the impurity-doped amorphous silicon pattern; and removing the first photoresist pattern.

15. The method according to claim 7, wherein the data line is disposed directly on the gate insulating layer.

16. The method according to claim 7, wherein a portion of the pixel electrode overlaps a portion of a previous gate line such that the overlapped portion of the previous gate line, the overlapped portion of the pixel electrode and the gate insulating layer between the overlapped portion of the previous gate line and the overlapped portion of the pixel electrode constitute a storage capacitor.

* * * * *